(12) United States Patent
Omura et al.

(10) Patent No.: US 7,627,262 B2
(45) Date of Patent: Dec. 1, 2009

(54) IMAGE FORMING APPARATUS HAVING HIGH VOLTAGE CIRCUIT BOARD AND AN INSULATIVE COVER

(75) Inventors: Hiroyoshi Omura, Osaka (JP); Tomohide Hozono, Osaka (JP)

(73) Assignee: Kyocera Mita Corporation, Osaka (JP)

( * ) Notice: Subject to any disclaimer, the term of this patent is extended or adjusted under 35 U.S.C. 154(b) by 368 days.

(21) Appl. No.: 11/287,491

(22) Filed: Nov. 28, 2005

(65) Prior Publication Data

US 2006/0160381 A1 Jul. 20, 2006

(30) Foreign Application Priority Data

Nov. 29, 2004 (JP) ............................. 2004-344378

(51) Int. Cl.
*G03G 15/00* (2006.01)
(52) U.S. Cl. ........................................ 399/88
(58) Field of Classification Search ................. 399/88
See application file for complete search history.

(56) References Cited

U.S. PATENT DOCUMENTS

| 5,791,914 | A * | 8/1998 | Loranger et al. ............. 439/71 |
| 2002/0098008 | A1 * | 7/2002 | Tashiro et al. ............. 399/107 |
| 2004/0114062 | A1 * | 6/2004 | Nishio et al. ............. 349/58 |
| 2005/0002168 | A1 * | 1/2005 | Narhi et al. ............. 361/800 |
| 2005/0002689 | A1 * | 1/2005 | Jeong et al. ............. 399/111 |
| 2006/0088333 | A1 * | 4/2006 | Watanabe et al. ............. 399/107 |

FOREIGN PATENT DOCUMENTS

| JP | 05181328 | A | * | 7/1993 |
| JP | 07319301 | A | * | 12/1995 |
| JP | 09083182 | A | * | 3/1997 |
| JP | 10051910 | A | * | 2/1998 |
| JP | 11325606 | A | * | 11/1999 |
| JP | 2001-347723 | | | 12/2001 |
| JP | 2003-195697 | | | 7/2003 |
| JP | 2004240403 | A | * | 8/2004 |

OTHER PUBLICATIONS

Computer translation of Noguchi et al., JP2004-240403a.*

* cited by examiner

*Primary Examiner*—Quana M Grainger
(74) *Attorney, Agent, or Firm*—Smith, Gambrell & Russell, LLP

(57) ABSTRACT

An image forming apparatus (1) according to the present invention includes a main frame (4B) which supports an image forming unit (2). An electric charger (7) is provided as a high voltage unit on a front side (D1) of the main frame (4B), and a high voltage circuit board (14) for applying a high voltage to the electric charger (7) is provided on a rear side (D2) of the main frame (4B) A cover (27) is provided as an insulative member on the high voltage circuit board (14) in opposed relation to the main frame (4B) for electrically isolating the high voltage circuit board (14) from the main frame (4B). The high voltage circuit board (14) is fixed directly to the main frame (4B) by the cover (27), and electrically connected to the electric charger via a resilient connector (25).

7 Claims, 8 Drawing Sheets

IMAGE FORMING APPARATUS HAVING HIGH VOLTAGE CIRCUIT BOARD AND AN INSULATIVE COVER

BACKGROUND OF THE INVENTION

1. Field of the Invention

The present invention relates to an image forming apparatus, for example, a copying machine, a printer, a facsimile machine or the like.

2. Description of Related Art

Image forming apparatuses typically include a hollow cylindrical rotatable photosensitive drum on which an electrostatic latent image is formed according to a light distribution, an electric charger which electrically charges the photosensitive drum by applying a high voltage, a developing device which develops the electrostatic latent image formed on the photosensitive drum with toner supplied by a developer roller, and the like. Further, a high voltage circuit board is provided for applying the high voltage to the electric charger (see, for example, Japanese Unexamined Patent Publication No. 2001-347723 and Japanese Unexamined Patent Publication No. 2003-195697).

In such an image forming apparatus, the high voltage circuit board is typically fixed to a planar main frame via a columnar fixing member.

Since the fixing member for the high voltage circuit board is provided separately from the main frame, the image forming apparatus requires a greater number of components and higher production costs.

Further, the high voltage circuit board is isolated from the main frame by providing a gap between the high voltage circuit board and the main frame. Therefore, the gap should be increased to ensure sufficient isolation for a predetermined high voltage. This results in size increase of the entire apparatus.

SUMMARY OF THE INVENTION

It is therefore a principal object of the present invention to provide a smaller size image forming apparatus.

It is another object of the present invention to provide an improved fixing arrangement for a high voltage circuit board in an image forming apparatus.

An image forming apparatus according to the present invention comprises a main frame, a high voltage unit provided on one of opposite sides of the main frame, a high voltage circuit board provided on the other side of the main frame for applying a high voltage to the high voltage unit, and an insulative member provided on a face of the high voltage circuit board opposed to the main frame for electrically isolating the high voltage circuit board from the main frame. The high voltage circuit board is fixed directly to the main frame by the insulative member.

Examples of the high voltage unit include an electric charger and a transfer charger.

In the present invention, the insulative member enhances the insulation between the high voltage circuit board and the main frame. Therefore, a distance between the main frame and the high voltage circuit board can be reduced, thereby the size of the image forming apparatus can be reduced. Further, the high voltage circuit board is disposed in close proximity to the main frame and fixed directly to the main frame. This simplifies an arrangement for fixing the high voltage circuit board to the main frame, and reduces the number of the components.

DETAILED DESCRIPTION OF PREFERRED EMBODIMENTS

An embodiment of the present invention will hereinafter be described in detail with reference to the attached drawings.

In this embodiment, a tandem full color printer will be described as an example of the inventive image forming apparatus, but the present invention is not limited to the tandem full color printer. Other examples of the image forming apparatus include copying machines, facsimile machines and image forming apparatuses adapted to form a monochrome image.

Figure 1:
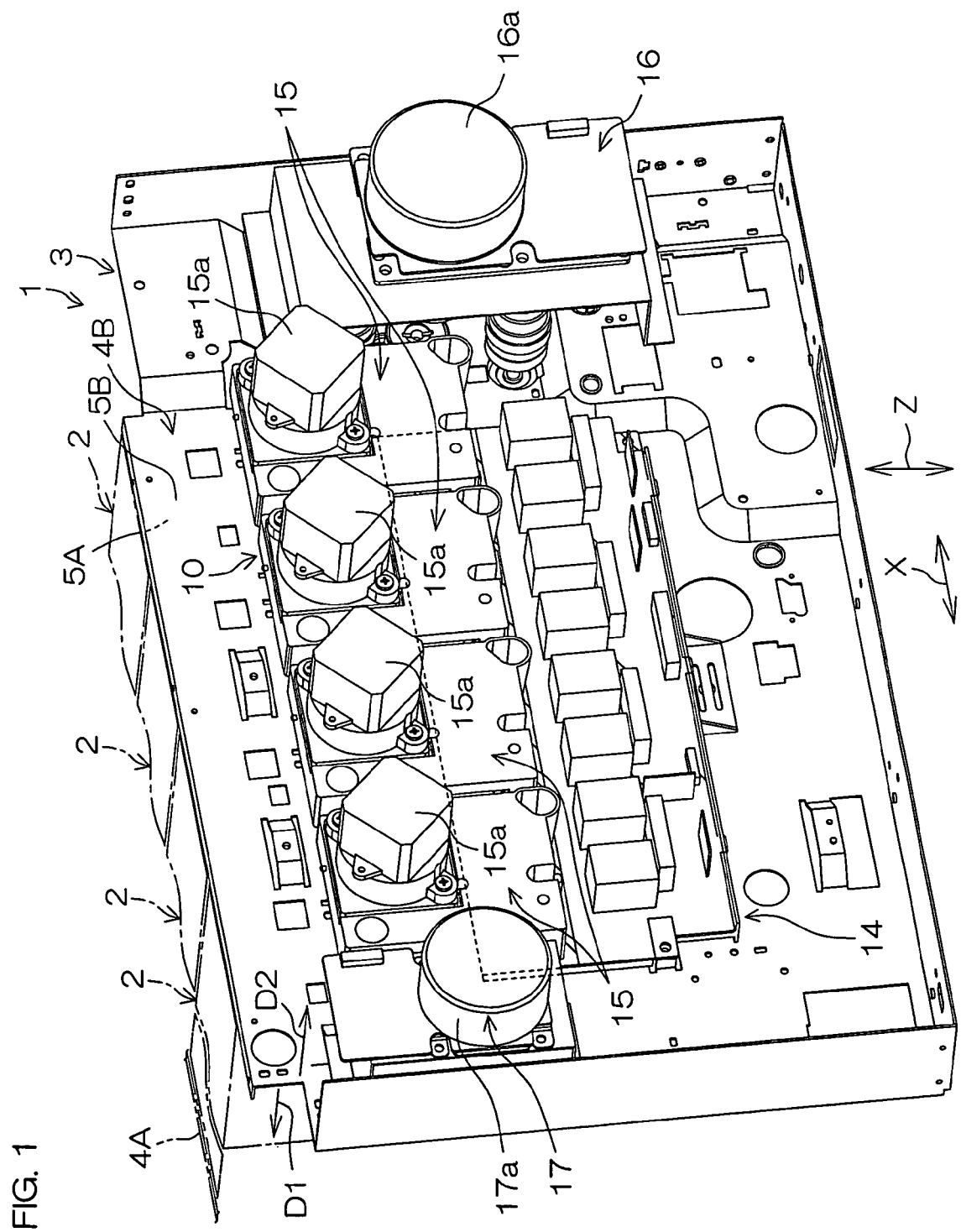
FIG. 1 is a perspective view of major portions of an image forming apparatus according to one embodiment of the present invention as seen from a rear side.

FIG. 1 is a perspective view of major portions of the image forming apparatus according to the embodiment of the present invention as seen from a rear side.

The image forming apparatus 1 includes a plurality of image forming units 2 (e.g., four image forming units 2) for yellow, magenta, cyan and black images, and a structural member 3 which supports these image forming units 2. In this embodiment, the four image forming units 2 are arranged laterally along an X-axis. The direction of the arrangement of the image forming units 2 may be arbitrarily defined.

The structural member 3 includes a pair of planar main frames 4A, 4B which are respectively disposed on a front side and a rear side of the image forming units 2 in the vicinity of the image forming units 2. The main frames 4A, 4B are spaced a predetermined distance from each other, and connected to each other by a connection member (not shown). The main frame 4B and its peripheral portion will be mainly described below.

Figure 2:
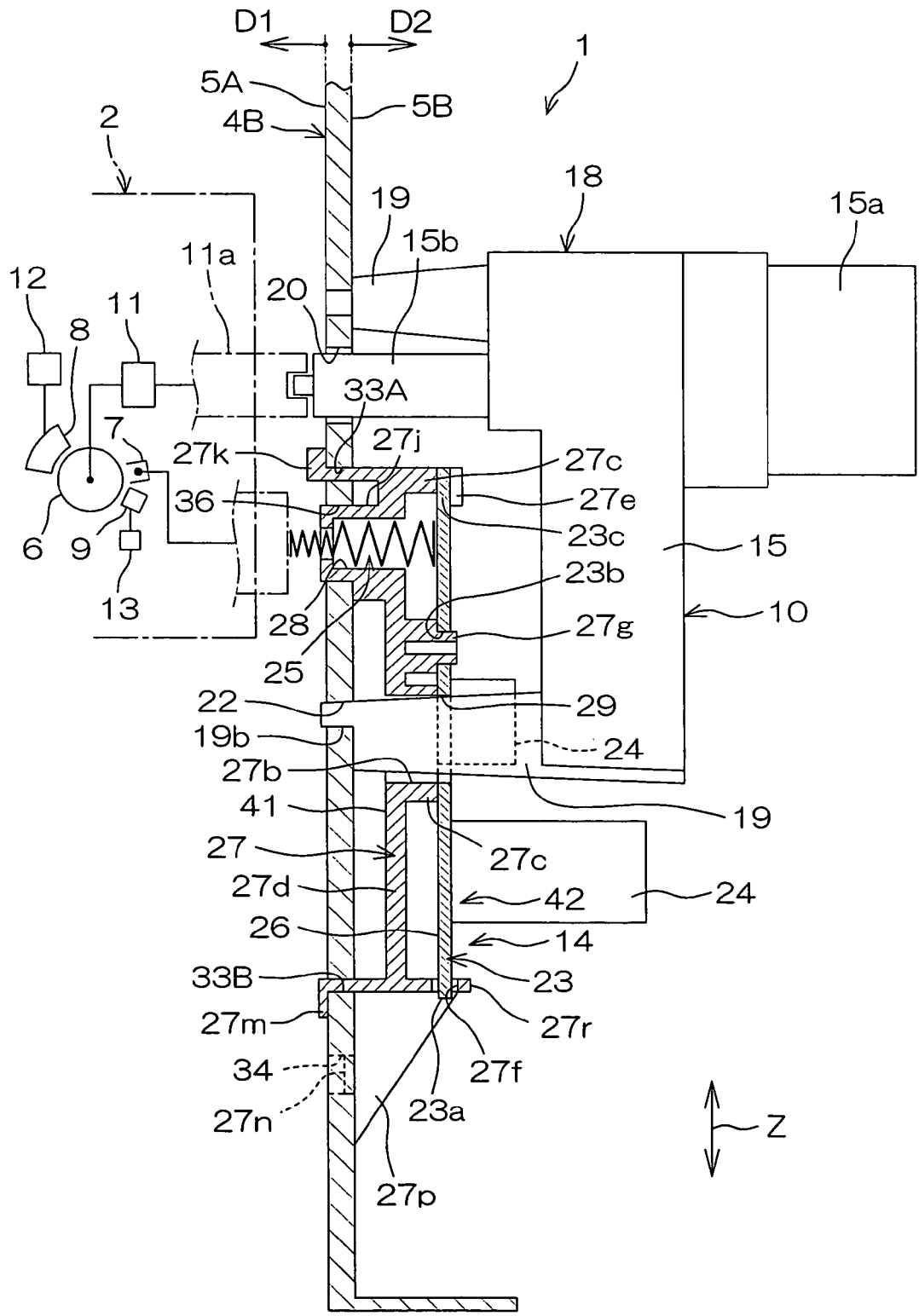
FIG. 2 is a sectional view of a main frame and other major portions of the image forming apparatus of FIG. 1 taken along a line II-II in FIG. 3.

FIG. 2 is a sectional view of the main frame 4B and its peripheral portion as major portions of the image forming apparatus 1 shown in FIG. 1. A reference will be made to FIGS. 1 and 2.

The main frame 4B is an electrically conductive metal plate, which extends vertically along a Z-axis and along the X-axis along which the image forming units 2 are arranged. The main frame 4B has a first partition face 5A located on one side thereof on which the image forming units 2 are disposed, and a second partition face 5B located on the other side thereof opposite from the first partition face 5A. More specifically, the first partition face 5A is defined by a front surface of the main frame 4B, and the second partition face 5B is defined by a rear surface of the main frame 4B.

The four image forming units 2 have the same construction. The image forming units 2 each include a hollow cylindrical photosensitive drum 6 on which an electrostatic latent image is formed according to a light distribution, an electric charger 7 as a high voltage unit which electrically charges the photosensitive drum 6, a developing device 8 which develops the electrostatic latent image formed on the photosensitive drum 6 into a toner image with toner supplied from a toner container by a developer roller, and a cleaner 9 for cleaning a surface of the photosensitive drum 6 after the toner image is transferred. These elements 6, 7, 8, 9 are disposed on a front (or inner) side D1 of the main frame 4B.

In each of the image forming units 2, the outer peripheral surface of the photosensitive drum 6 is uniformly electrically charged by the electric charger 7, while the photosensitive drum 6 is rotated. Then, the outer peripheral surface of the photosensitive drum 6 is exposed to a laser beam emitted from a laser beam generator (not shown). Thus, an electrostatic latent image corresponding to a desired image is formed on the outer peripheral surface of the photosensitive drum 6, and developed into a toner image of a predetermined color by the developing device 8. The toner images of the four respective colors formed on the photosensitive drums 6 are successively transferred onto a paper sheet in superposed relation by a transfer device (not shown), and thermally fixed to the paper sheet in a fixing device (not shown).

The image forming apparatus 1 further includes a driving unit 10, driving mechanisms 11, 12, 13 which are driven by the driving unit 10 to rotate the photosensitive drums 6, the developer rollers of the developing devices 8 and cleaning rollers of the cleaners 9, respectively, and a high voltage circuit board 14 which applies a high voltage to the electric chargers 7. The driving unit 10 and the high voltage circuit board 14 are disposed on a rear (or outer) side D2 of the main frame 4B in at least partly overlapping relation as seen anteroposteriorly.

The driving mechanisms 11 are provided for the respective image forming units 2, and each include a transmission shaft 11a as a power transmission member. Similarly, the driving mechanisms 12, 13 are provided for the respective image forming units 2, and each include a transmission shaft (not shown) as a power transmission member.

The driving unit 10 includes a plurality of units 15, 16, 17, and is fixed to the main frame 4B by means of fixing legs 19 projecting from a unit body 18.

The driving unit 10 includes four electric motors 15a for respectively driving the photosensitive drums 6 of the four image forming units 2, an electric motor 16a for driving the four developing devices 8, an electric motor 17a for driving the four cleaners 9, and a plurality of transmission shafts 15b for power transmission from the electric motors 15a, 16a, 17a. These transmission shafts 15b extend through through-holes 20 of the main frame 4B to be respectively coupled to the corresponding transmission shafts of the driving mechanisms 11, 12, 13 of the corresponding image forming units 2.

In this embodiment, a cover 27 is provided as an insulative member for electrically isolating the high voltage circuit board 14 from the main frame 4B. The cover 27 is provided on a surface of the high voltage circuit board 14 opposed to the main frame 4B. The high voltage circuit board 14 is fixed directly to the second partition face 5B of the main frame 4B from the outer side D2 by the cover 27.

Figure 3:
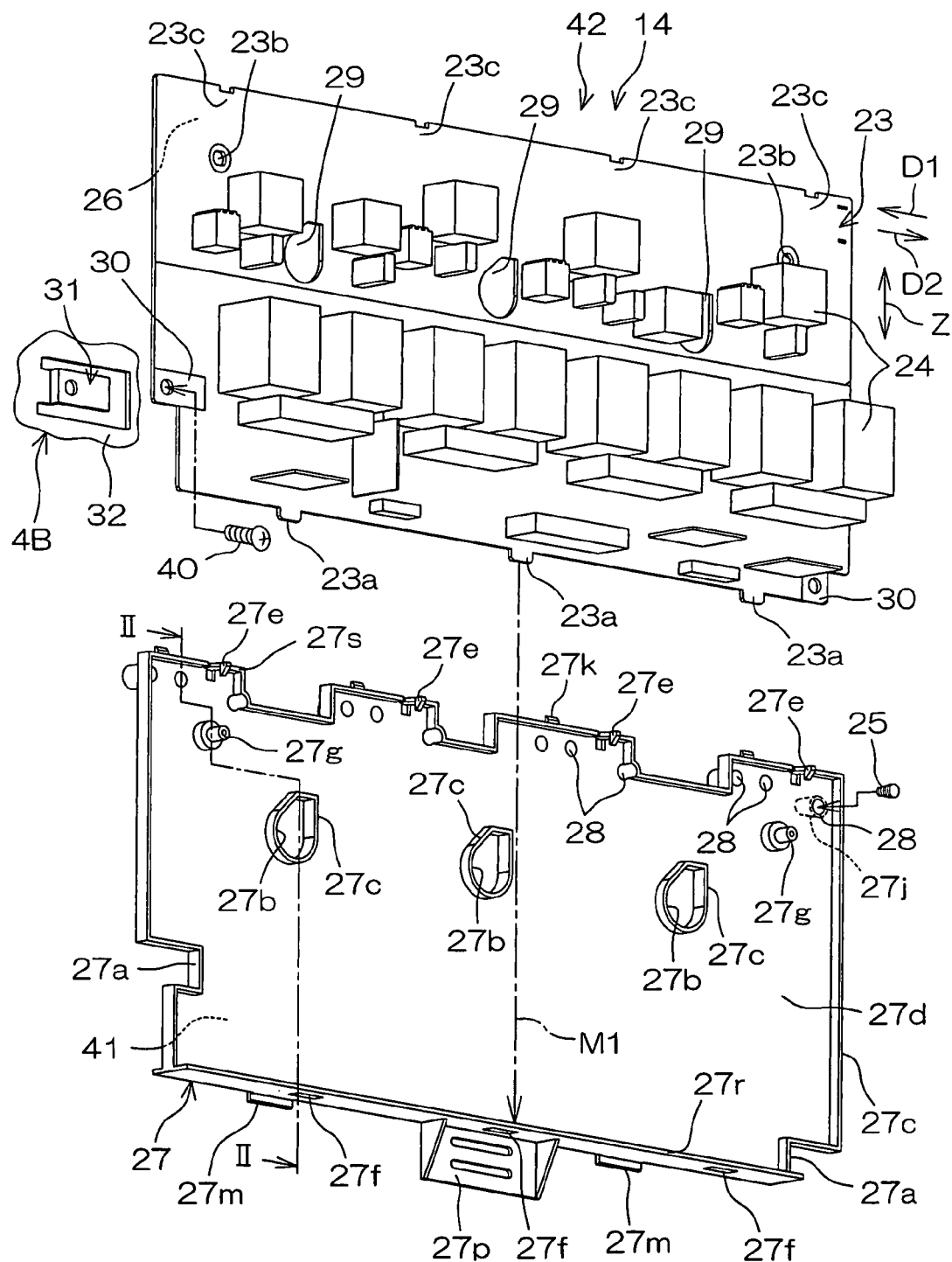
FIG. 3 is an exploded perspective view of a high voltage circuit board of FIG. 2.

FIG. 3 is an exploded perspective view of the high voltage circuit board 14. A reference will be made to FIGS. 2 and 4.

The high voltage circuit board 14 includes a printed wiring board 23, components 24 mounted thereon, resilient connectors 25 for connection, and a planar cover 27. The printed wiring board 23 and the mounted components 24 constitute a circuit board body 42. The circuit board body 42 is shared by the four image forming units 2. The planar cover 27 is attached to an inner face 26 of the circuit board body 42 (a back face of the printed wiring board 23). The cover 27 is stacked on the inner face 26 of the circuit board body 42 to cover the inner face 26. The cover 27 includes retaining portions 28 which respectively retain the resilient connectors 25. The circuit board body 42 and the cover 27 constitute a board unit, which is detachable from the main frame 4B.

The components 24 mounted on the printed wiring board 23 include circuit elements, such as a transformer, which constitute a high voltage circuit.

The printed wiring board 23 includes an insulative board having a rectangular shape elongated in one direction, and a predetermined electrically conductive pattern formed on the insulative board. The electrically conductive pattern and the aforesaid circuit elements are electrically connected to constitute the high voltage circuit for applying a high voltage to the high voltage unit (e.g., the electric charger 7).

The components 24 are mounted on a front (or outer) face of the printed wiring board 23 located on the outer side D2. On the other hand, no component is mounted on the back (or inner) face of the printed wiring board 23, but components (not shown) having a smaller size or a smaller thickness may be mounted on the back face of the printed wiring board 23. The printed wiring board 23 has through-holes 29 through which the legs 19 extend.

The printed wiring board 23 has a plurality of fixing portions 30 (two fixing portions 30 in this embodiment) for fixing the printed wiring board 23 directly to the main frame 4B. The fixing portions 30 are provided in longitudinally opposite edge portions of the printed wiring board 23. The fixing portions 30 each have a through-hole, around which parts of the electrically conductive pattern are provided on opposite sides of the fixing portion 30.

The main frame 4B has a plurality of to-be-fixed portions 31 provided in opposed relation to the fixing portions 30 of the printed wiring board 23. The fixing portions 30 of the printed wiring board 23 are respectively fixed to the to-be-fixed portions 31. The to-be-fixed portions 31 are formed integrally with the main frame 4B. For example, the to-be-fixed portions 31 are cantilever tongues which are each formed by incising and raising a part of a flat portion 32 of the main frame 4B. The tongues each have a seat spaced a predetermined distance from the flat portion 32 of the main frame 4B to the outer side D2, and the seat has a through-hole. The through-hole of the seat is formed with a female thread.

Bolts 40 are respectively screwed into the through-holes of the to-be-fixed portions 31 through the through-holes of the fixing portions 30. Thus, the parts of the electrically conductive pattern around the fixing portions 30 of the printed wiring board 23 are electrically connected to the main frame 4B for grounding.

The cover 27 is a synthetic resin member separate from the printed wiring board 23. Exemplary synthetic resin materials for the synthetic resin member include polycarbonate resins, ABS resins, fluorocarbon resins, polyethylene resins, acryl resins, polypropylene resins, nylon resins, polystyrene resins and polybutylene terephthalate (PBT) resins. The material for the cover 27 is not limited to the synthetic resin materials, but a ceramic material or the like may be used as the material for the cover 27. Among the aforesaid materials, a material having a volume resistivity of not lower than $1 \times 10^{14}$ Ωcm is preferred.

The cover 27 has clearance portions 27a so as not to cover the fixing portions 30 and the to-be-fixed portions 31. The cover 27 is fixed to the inner face 26 of the circuit board body 42 of the high voltage circuit board 14 as covering a lower end face of the printed wiring board 23 and the entire inner face 26 except for the clearance portions 27a. Particularly, the cover 27 covers a portion of the high voltage circuit board 14 to which the high voltage is applied.

The cover 27 has through-holes 27b through which the legs 19 extend. The cover 27 has projections 27c extending along outer peripheral edges thereof and peripheral edges of the through-holes 27b and projecting from a flat portion 27d thereof to the outer side D2. The projections 27c except a portion 27r provided along a lower edge of the cover 27 abut against an outer peripheral edge portion of the inner face of the printed wiring board 23 and peripheral edges of the through-holes 29. The portion 27r of the projection 27c provided along the lower edge of the cover 27 projects to a greater extent to cover the lower end face of the printed wiring board 23. The flat portion 27d of the cover 27 is spaced a predetermined distance from the inner face 26 of the circuit board body 42.

In this embodiment, the cover 27 is fitted on the high voltage circuit board 14 to be combined with the high voltage circuit board 14. The cover 27 has hooks 27e, engagement holes 27f and positioning portions 27g as engagement portions. The printed wiring board 23 has edge portions 23c, projections 23a and engagement holes 23b as engagement portions. The engagement portions of the cover 27 are engaged with the corresponding engagement portions of the printed wiring board 23.

Figure 4:
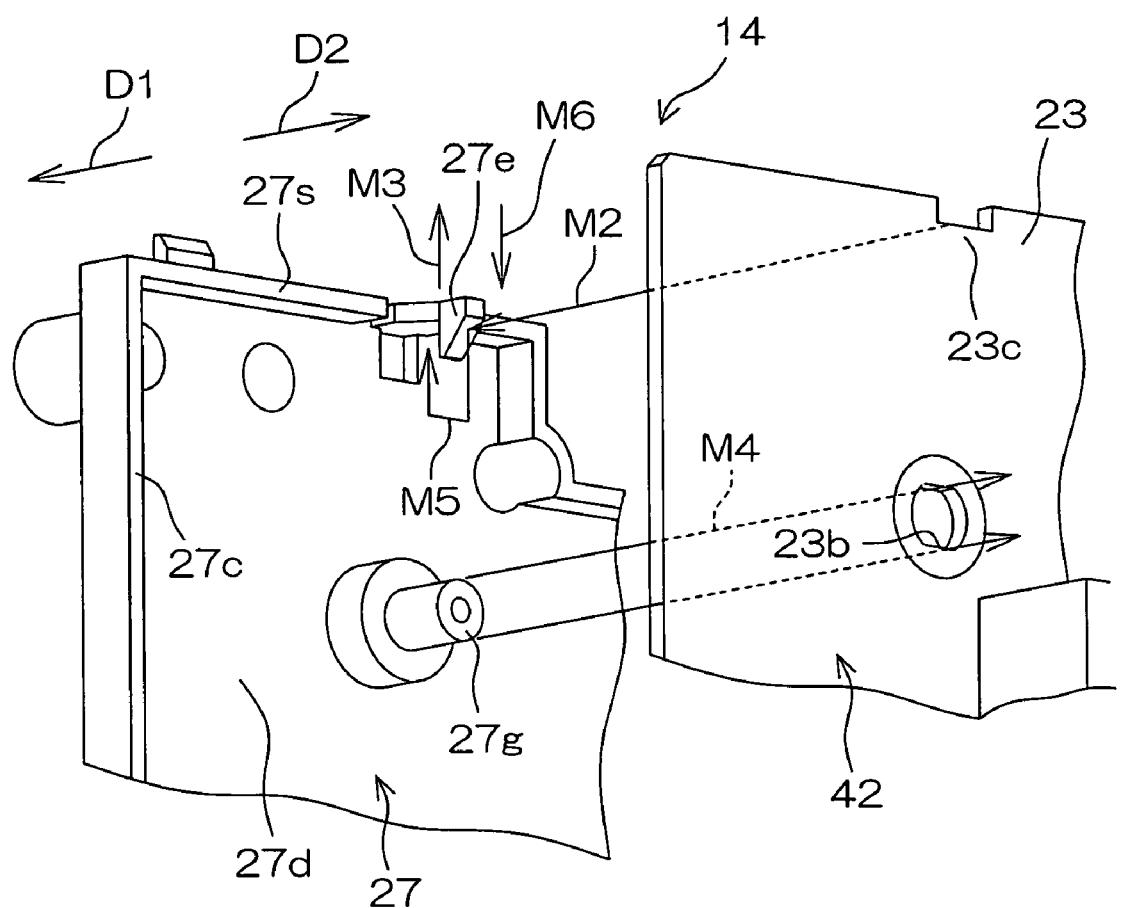
FIG. 4 is an enlarged exploded perspective view of major portions of the high voltage circuit board of FIG. 3.
Figure 5:
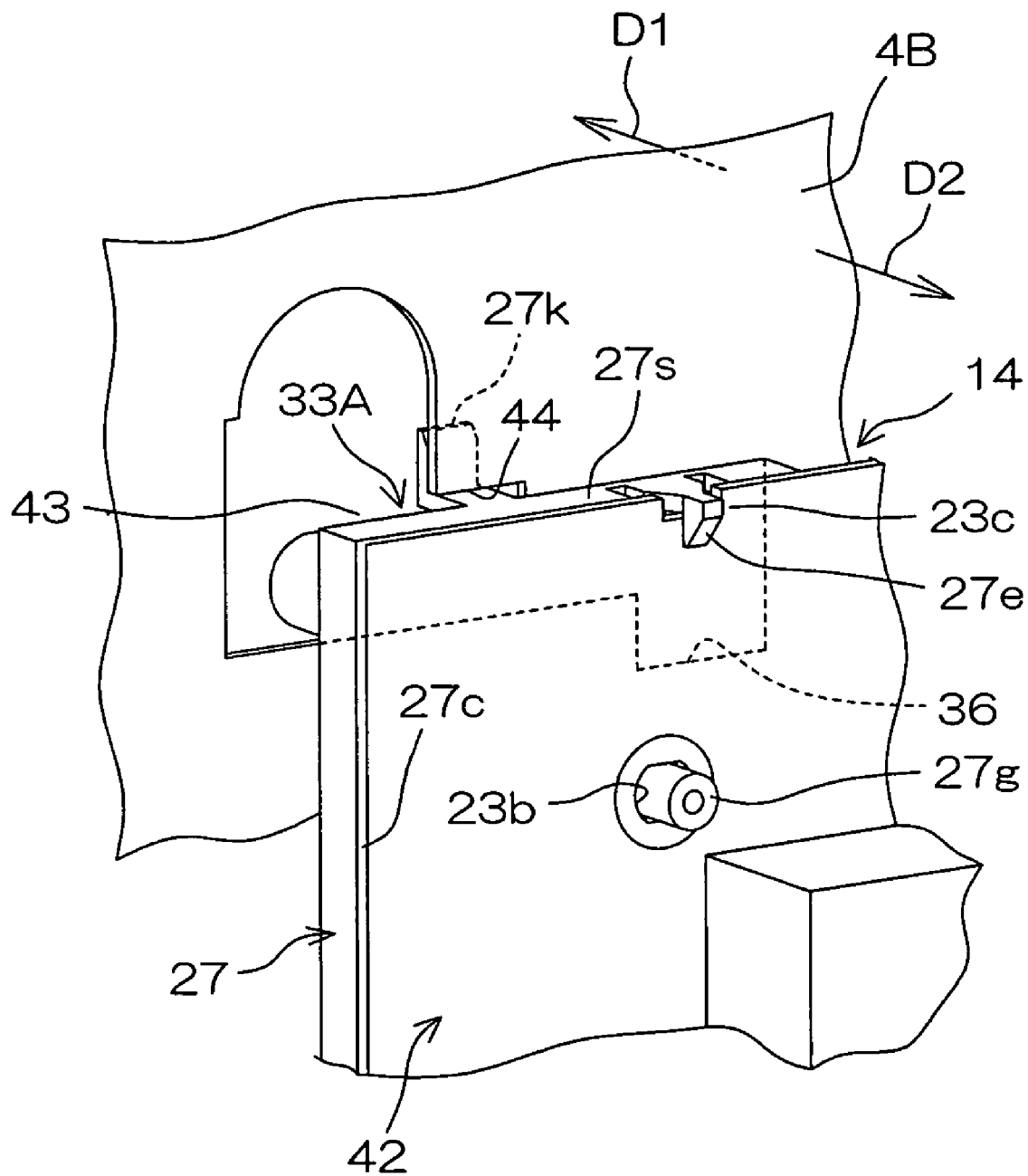
FIG. 5 is a perspective view of the high voltage circuit board fixed to the main frame.

FIG. 4 is an enlarged exploded perspective view of major portions of the circuit board body 42 and the cover 27 shown on a left upper side of FIG. 3. FIG. 5 is a perspective view of the high voltage circuit board 14 fixed to the main frame 4B. A reference will be made to FIGS. 3, 4 and 5.

The hooks 27e (e.g., four hooks 27e) are provided on an upper edge of the cover 27 in a vertically resiliently deformable manner as projecting to the outer side D2 in a cantilever shape. The edge portions 23c provided on an upper edge of the printed wiring board 23 are hooked by the hooks 27e to be held between the hooks 27e and portions 27s of the projection 27c located along the upper edge of the cover 27. Thus, the hooks 27e are engaged with the edge portions 23c.

The positioning portions 27g are cylindrical projections projecting from the flat portion 27d of the cover 27 to the outer side D2, and engaged with the engagement holes 23b of the printed wiring board 23.

Referring to FIGS. 2 and 3, the engagement holes 27f (e.g., three engagement holes 27f) are provided in the portion 27r of the projection 27c located along the lower edge of the cover 27. The projections 23a projecting downward from a lower edge of the printed wiring board 23 are fitted in the engagement holes 27f.

Referring to FIGS. 3 and 4, the cover 27 is combined with the high voltage circuit board 14 in the following manner. First, the projections 23a of the printed wiring board 23 are fitted in the engagement holes 27f of the cover 27 (as indicated by an arrow M1). As the inner face of the printed wiring board 23 approaches the cover 27 (as indicated by an arrow M2), the hooks 27e of the cover 27 are resiliently deformed to be pushed upward by the edge portions 23c (as indicated by an arrow M3). Thus, the positioning portions 27g of the cover 27 are fitted in the engagement holes 23b of the printed wiring board 23 (as indicated by an arrow M4). Further, the edge portions 23c get over distal portions of the hooks 27e (as indicated by an arrow M5), and the hooks 27e of the cover 27 are displaced downward by the resilience of the hooks 27e (as indicated by an arrow M6). Referring to FIGS. 2 and 5, the hooks 27e are brought into contact with the edge portions 23c in anteroposteriorly opposed relation, whereby movement of the cover 27 relative to the printed wiring board 23 is restricted.

Figure 6:
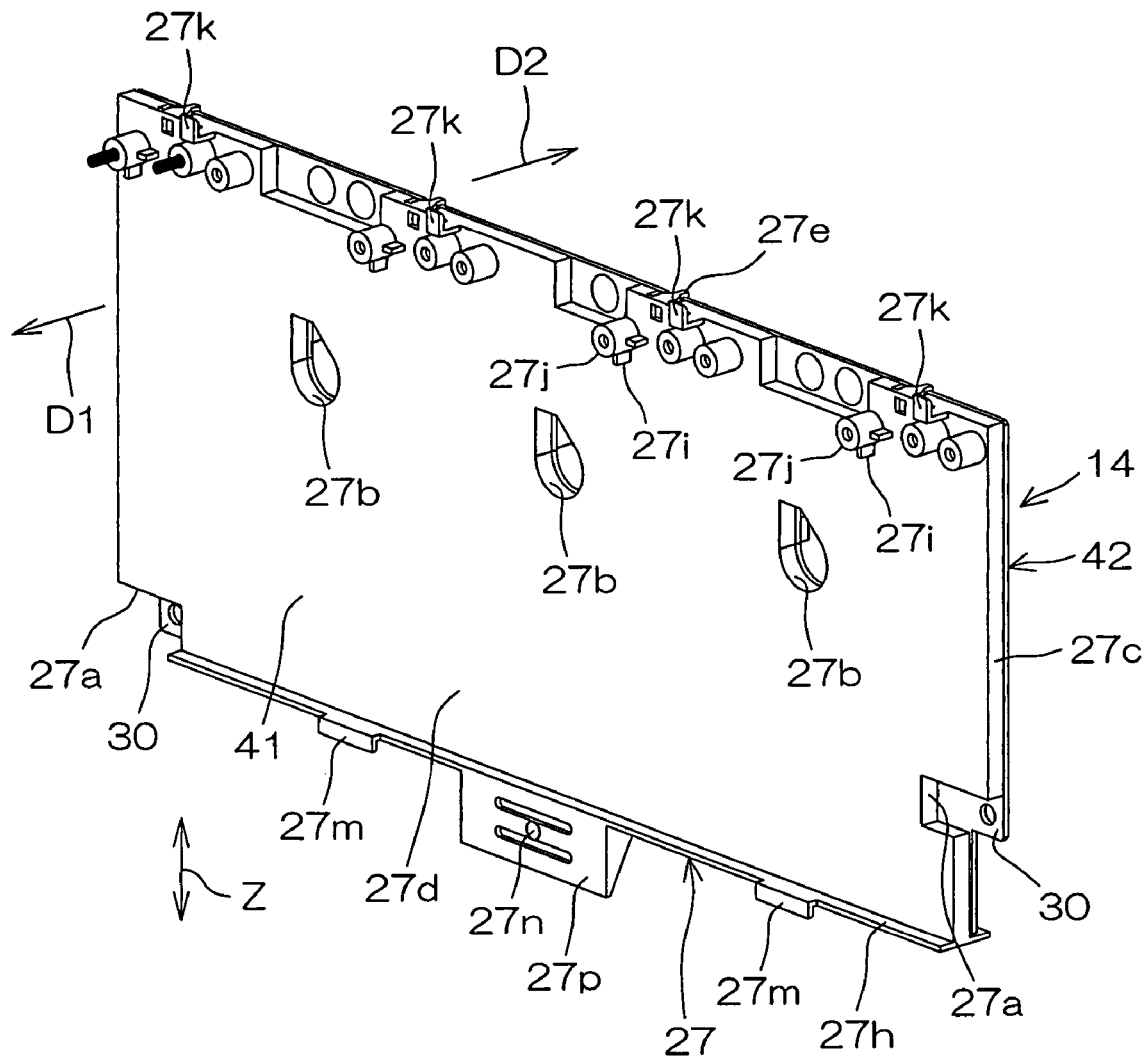
FIG. 6 is a perspective view of the high voltage circuit board of FIG. 3 as seen from a front side.

FIG. 6 is a perspective view of the board unit as seen from the front side. A reference will be made to FIGS. 2 and 6.

The cover 27 is held on the second partition face 5B of the main frame 4B so that the movement of the cover 27 relative to the main frame 4B is restricted. Accordingly, the high voltage circuit board 14 held on the main frame 4B by the cover 27 can be easily fixed directly to the main frame 4B by the fixing portions 30. In addition, the bolts 40 (see FIG. 3) for the fixing at the fixing portions 30 may be eliminated.

The cover 27 has a first projection 27h and second projections 27i as restricting portions. With the restricting portions in abutment against the main frame 4B, the flat portion 27d is restrictively spaced a predetermined distance from the second partition face 5B of the main frame 4B. The first projection 27h is a flange extending along the lower edge of the cover 27 and projecting to a predetermined distance from the flat portion 27d toward the inner side D1. The second projections 27i are ribs provided on the upper edge portion of the cover 27 as projecting to a predetermined distance from the flat portion 27d toward the inner side D1. These ribs are provided at proximal portions of bosses 27j.

In this embodiment, the cover 27 further has hooks 27k, 27m and a projection 27n provided as fixing engagement portions (projections) on the front side D1 thereof opposed to the main frame 4B. These fixing engagement projections 27k, 27m, 27n are engaged with engagement holes 33A, 33B and an engagement hole 34 provided as engagement portions (holes) in the main frame 4B.

Figure 7:
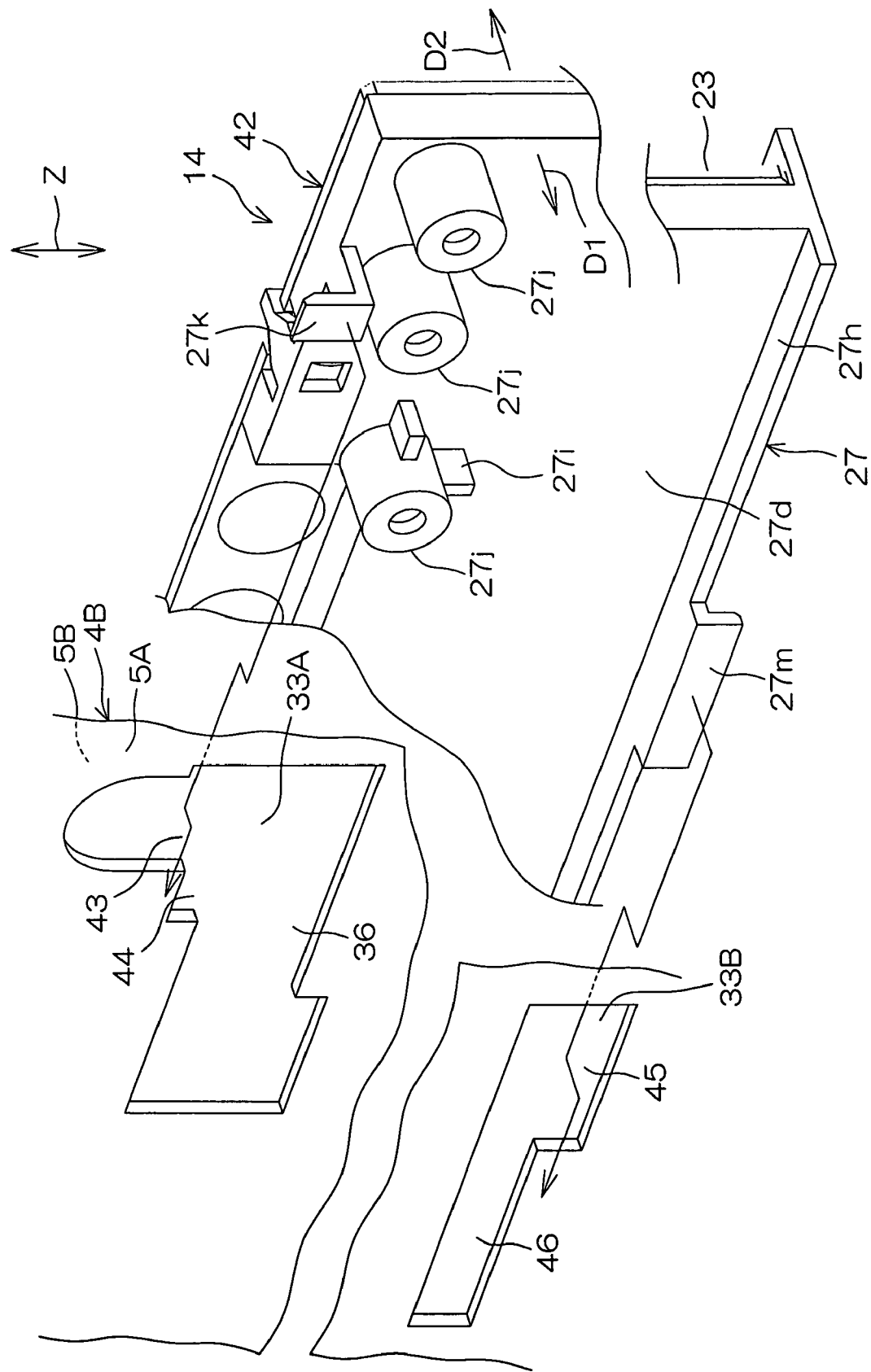
FIG. 7 is an exploded perspective view of major portions of a cover and the main frame shown in FIG. 6.

FIG. 7 is an exploded perspective view of a portion of the cover 27 shown on a right side of FIG. 6 and major portions of the frame 4B. A reference will be made to FIGS. 5 and 7.

The hooks 27k (e.g., four hooks 27k) are provided in closely opposed relation to the corresponding image forming units 2 as projecting from the upper edge of the cover 27 toward the inner side D1 with their distal portions bent upward. Engagement holes 33A are provided in the main frame 4B in opposed relation to the hooks 27k. The engagement holes 33A each have an inlet portion 43 having a size sufficient to receive the hook 27k, and an introduction portion 44 laterally adjacent to the inlet portion 43. The engagement holes 33A respectively communicate with through-holes 36 through which the bosses 27j of the cover 27 are inserted. The distal portions of the hooks 27k abut against upper edges of the introduction portions 44 from the inner side D1.

The hooks 27m (e.g., two hooks 27m) project from the first projection 27h of the cover 27 toward the inner side D1 with their distal portions bent downward. Engagement holes 33B are provided in the main frame 4B in opposed relation to the hooks 27m. The engagement holes 33B each have an inlet portion 45 having a size sufficient to receive the hook 27m, and an introduction portion 46 laterally adjacent to the inlet portion 45. The distal portions of the hooks 27m abut against lower edges of the introduction portions 46 from the inner side D1.

The hooks 27k, 27m and the engagement holes 33A, 33B restrict vertical and anteroposterior movement of the cover 27 relative to the main frame 4B.

Referring to FIGS. 2 and 6, the projection 27n is a cylindrical positioning portion projecting from a flange 27p provided on the lower edge of the cover 27 toward the inner side D1. The projection 27n is fitted in engagement hole 34 provided as a positioning portion in the frame 4B. Thus, vertical and lateral movement of the cover 27 relative to the frame 4B is restricted.

The projection 27n is resiliently supported in an anteroposteriorly (D1-D2) displaceable manner. The flange 27p has a pair of parallel slits, between which a leaf spring elongated in one direction is provided as a resiliently deformable portion. The projection 27n projects from a longitudinally middle portion of the resiliently deformable portion.

Referring to FIGS. 2 and 7, the cover 27 is combined with the frame 4B in the following manner. First, the hooks 27k, 27m are respectively inserted into the inlet portions 43, 45 of the engagement holes 33A, 33B. At this time, the projection 27n is resiliently displaced rearward so as not to prevent the insertion. The hooks 27k, 27m are laterally slid along the introduction portions 44, 46, so that the distal portions of the hooks 27k, 27m inserted into the engagement holes 33A, 33B are brought into abutment against the corresponding edges of the introduction portions 44, 46. When the hooks 27k, 27m respectively reach the innermost ends of the introduction portions 44, 46, the projection 27n is positioned in opposed relation to the engagement hole 34, and resiliently displaced forward to be automatically fitted in the engagement hole 34. The projection 27n is prevented from being inadvertently disengaged from the engagement hole 34 by the resilience of the projection 27n.

The inner face 26 of the circuit board body 42 is spaced a predetermined distance from the second partition face 5B of the main frame 4B by the cover 27. The predetermined distance should be sufficient to electrically isolate the main frame 4B from a high voltage portion of the circuit board body 42 to which a predetermined high voltage is applied. The distance is set to not shorter than a distance determined depending on the material for the cover 27 and the thickness of the cover 27.

The cover 27 has plural sets of retaining portions 28, which are provided for the respective image forming units 2. The retaining portions 28 are disposed in the upper edge portion of the cover 27 in the vicinity of the corresponding image forming units 2.

Figure 8:
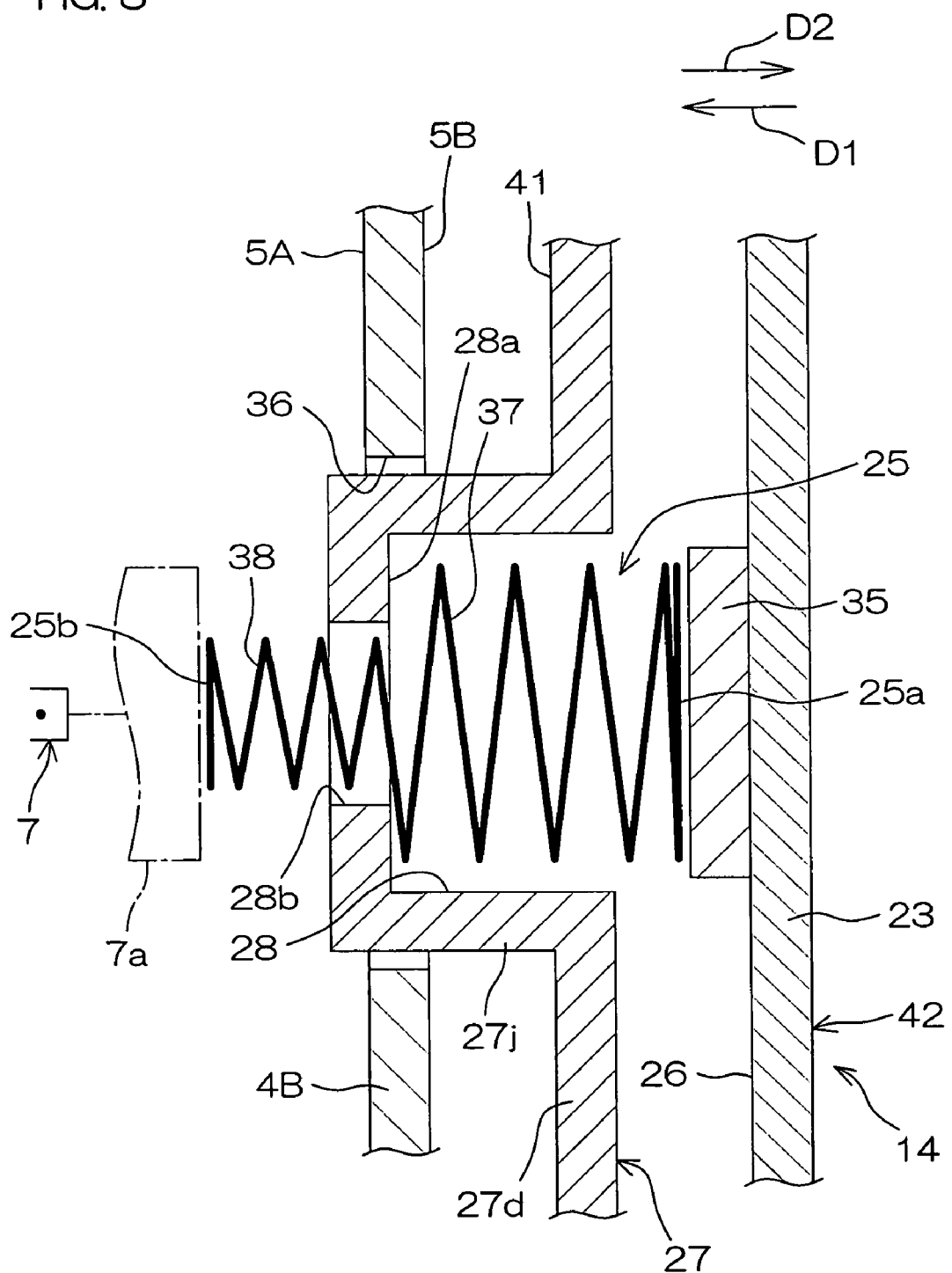
FIG. 8 is a schematic sectional view of a retaining portion shown in FIG. 2.

Referring to FIG. 8, a terminal 35 is provided on the inner face 26 of the circuit board body 42 in opposed relation to the retaining portion 28. The main frame 4B has a through-hole 36. A terminal 7a of the electric charger 7 as the high voltage unit is disposed on the inner side D1 of the main frame 4B. The retaining portion 28, the terminal 35, the through-hole 36, the terminal 7a and the resilient connector 25 retained in the retaining portion 28 are arranged along an axis anteroposteriorly extending in a direction D1-D2.

The terminal 7a is an electrically conductive member, which functions as one of opposite connectors which is provided on the side of the electric charger 7. On the other hand, the resilient connector 25 functions as the other connector provided on the side of the high voltage circuit board 14. These connectors are electrically connected to each other in contact with each other. The connectors are brought into or out of contact with each other for establishing or canceling the electrical connection therebetween simply by attaching or detaching the high voltage circuit board 14 to/from the main frame 4B.

Examples of the high voltage unit include the developing device 8 (see FIG. 2) and the transfer device such as a transfer charger in addition to the electric charger 7, and at least one of these devices maybe connected to the high voltage circuit board 14 as in this embodiment. In this case, the retaining portion 28, the resilient connector 25, the terminal 35 and the like may be configured in substantially the same manner as described above, except that the high voltage unit to be connected to the resilient connector 25 is different. An explanation will be given to a case where the high voltage unit is the electric charger 7 of the image forming unit 2.

The resilient connector 25 includes a compression coil spring composed of an electrically conductive material such as a metal. Terminals 25a, 25b are provided at opposite ends of the spring. In this embodiment, the resilient connector 25 has a greater diameter portion 37 having a greater outer diameter and a smaller diameter portion 38 having a smaller outer diameter. The greater diameter portion 37 and the smaller diameter portion 38 are coaxial and continuous, and composed integrally of a single wire material.

The retaining portion 28 is formed integrally with the cover 27. The retaining portion 28 has a bottomed hollow cylindrical shape, and is defined in the boss 27j projecting from the flat portion 27d of the cover 27 toward the inner side D1. The resilient connector 25 is retained along an inner peripheral surface of the boss 27j as extending in a direction perpendicular to the inner face 26 of the circuit board body 42 so as to be resiliently deformable in this direction. A through-hole 28b is provided in a bottom 28a of the retaining portion 28.

A step between the smaller diameter portion 38 and the greater diameter portion 37 abuts against the bottom 28a of the retaining portion 28. The smaller diameter portion 38 extends through the through-hole 28b. The greater diameter portion 37 of the resilient connector 25 is held between the bottom 28a of the retaining portion 28 and the printed wiring board 23, whereby the resilient connector 25 is prevented from being disengaged from the retaining portion 28.

The terminal 35 is provided as a part of the electrically conductive pattern of the printed wiring board 23, but may be provided as a separate electrically conductive member attached to the printed wiring board 23.

The resilient connector 25 is surrounded by the insulative retaining portion 28, and extends through the through-hole 36 of the main frame 4B. Thus, the resilient connector 25 is assuredly electrically isolated from the main frame 4B.

The resilient connector 25 is compressed to be resiliently deformed with its terminal 25a in contact with the terminal 35 of the high voltage circuit board 14 for electrical connection. The resilient connector 25 extends through the insulative cover 27 to project from a surface 41 of the high voltage circuit board 14 opposed to the main frame 4B, and the terminal 25b provided at a projecting distal end of the resilient connector 25 reaches the inner side D1 of the first partition face 5A to contact the terminal 7a of the electric charger 7 for electrical connection. As a result, electrical connection between the high voltage circuit board 14 and the electric charger 7 is established.

According to the embodiment of the present invention, the insulation between the high voltage circuit board 14 and the main frame 4B can be enhanced by the insulative cover 27 as compared with a case where the insulation is achieved simply by a gap between the high voltage circuit board 14 and the main frame 4B. Therefore, a distance between the main frame 4B and the high voltage circuit board 14 required for the insulation can be reduced. As a result, the size reduction of the image forming apparatus 1 can be achieved. Further, the high voltage circuit board 14 is disposed in close proximity to the frame 4B, and fixed directly to the frame 4B by the cover 27. This simplifies the arrangement for fixing the high voltage circuit board 14 to the-frame 4B and reduces the number of the components.

More specifically, the electrical connection between the high voltage circuit board 14 and the high voltage unit can be achieved by the resilient connector 25 or a like connector, which makes it possible to reduce the number of wirings for the electrical connection or eliminate the wirings. As a result, the number of components and assembling costs can be reduced. Further, the reduction of the number of the wirings or the elimination of the wirings improves the assembling efficiency.

Where the resilient connector 25 is employed as the connector, the resilient connector 25 is resiliently deformed to accommodate its dimensional error and assembling error, and the electrical connection is assuredly established.

Further, the cover 27 is fitted on the high voltage circuit board 14 to be stacked on the high voltage circuit board 14 without the use of bolts or like fixing members. This reduces the number of components for stacking the cover 27 on the high voltage circuit board 14 and, as a result, reduces the assembling costs.

The projections formed integrally with the cover 27 are used for fixing the high voltage circuit board 14 to the main frame 4B. This reduces the number of components for the fixing of the high voltage circuit board 14 and, as a result, reduces the assembling costs. Where the fixing of the high voltage circuit board 14 is achieved by employing a pair of a projection and a hole to be engaged with each other, the number of the components can be advantageously further reduced.

The disengagement of the cover 27 can be automatically prevented by the engagement of the hooks 27e, the projections 27n and the like utilizing the resilience of the synthetic resin cover 27. This simplifies or eliminates an operation for the prevention of the disengagement, thereby facilitating operations for stacking the cover 27 on the high voltage circuit board 14 and fixing the high voltage circuit board 14 to the main frame 4B.

The cover 27 is preferably configured so as to close a peripheral gap between the high voltage circuit board 14 and the main frame 4B, whereby foreign matters which may otherwise lead to reduced insulation is prevented from intruding into the gap between the high voltage circuit board 14 and the main frame 4B. Further, the peripheral edge of the cover 27 is preferably reinforced by the rib-like projections 27c of the cover 27, whereby the high voltage circuit board 14 is prevented from being warped. In addition, the cover 27 is highly insulative, so that dielectric breakdown can be prevented which may otherwise occur due to reduction of the insulation distance attributable to the foreign matters and the warp.

The following modifications of the embodiment are conceivable. Arrangements different from those of the embodiment described above will hereinafter be mainly described, and like components will be denoted by like reference characters.

For example, it is conceivable to modify the arrangement for the connection between the main frame 4B and the cover 27 such that projections are provided on the main frame 4B and holes are provided in the cover 27 conversely to the aforesaid embodiment. For example, the hooks 27k may be provided on the main frame 4B, and the engagement holes 33A may be provided in the cover 27. Similarly, the other arrangements may be modified, and the arrangement for the connection between the cover 27 and the printed wiring board 23 may be modified.

In the arrangement for fixing the high voltage circuit board 14 directly to the main frame 4B, the high voltage circuit board 14 maybe only mechanically connected to the main frame 4B. The fixing portions 30 may be provided as at least parts of the components mounted on the printed wiring board 23. The to-be-fixed portions 31 of the main frame 4B may be components integrally fixed to the main frame 4B. It is also conceivable to fix the high voltage circuit board 14 to the main frame 4B only by the projections and the holes without the use of the bolts 40 or only by the bolts 40 without the use of the projections and the holes.

Though not shown, a resilient connector such as a compression coil spring having a constant diameter or a leaf spring, or a rigid connector not having resilience may be used as the connector. It is also conceivable to employ a wire without the use of the connector.

The cover 27 may cover only the inner face 26 of the circuit board body 42. A synthetic resin member may be formed as the insulative member integrally with the printed wiring board 23 to substantially entirely cover the inner face of the printed wiring board 23. The insulative member may be composed of an insulative material other than the synthetic resin material. At least the surface 41 of the high voltage circuit board 14 opposed to the main frame 4B may be composed of the insulative material or covered with the insulative member.

The high voltage circuit board 14 may be fixed to an outer surface of the front main frame 4A. Other various modifications may be made within the scope of the present invention defined by the appended claims.

What is claimed is:

1. An image forming apparatus comprising:
a main frame which is made of an electrically conductive metal plate;
a high voltage unit provided at one of opposite sides of the main frame;
a high voltage circuit board provided at the other side of the main frame for applying a high voltage to the high voltage unit; and
an insulative cover covered over a surface of the high voltage circuit board opposed to the main frame for electrically isolating the high voltage circuit board from the main frame, wherein the high voltage circuit board is fixed to the main frame by the insulative cover.

2. The image forming apparatus as set forth in claim 1, wherein the high voltage circuit board has a connector projecting from the inner surface thereof opposed to the main frame through the insulative cover, and the high voltage circuit board is electrically connected to the high voltage unit by the connector.

3. The image forming apparatus as set forth in claim 1, wherein the insulative cover is fitted on the high voltage circuit board to be stacked on the high voltage circuit board without the use of a fixing member.

4. The image forming apparatus as set forth in claim 2, wherein the insulative cover is fitted on the high voltage circuit board to be stacked on the high voltage circuit board without the use of a fixing member.

5. The image forming apparatus as set forth in claim 1, wherein the insulative cover has at least one of a fixing projection and a fixing hole provided on a face thereof opposed to the main frame, and is fixed to the main frame with the at least one of the fixing projection and the fixing hole in engagement with the main frame.

6. The image forming apparatus as set forth in claim 1, wherein the insulative cover has a volume resistively of not lower than $1 \times 10^{14} \Omega$ cm.

7. The image forming apparatus as set forth in claim 1, wherein the insulative cover is made with synthetic resin materials, or ceramic materials.

* * * * *